United States Patent [19]

Rusch

[11] Patent Number: 4,673,965

[45] Date of Patent: Jun. 16, 1987

[54] USES FOR BURIED CONTACTS IN INTEGRATED CIRCUITS

[75] Inventor: Randy A. Rusch, Kokomo, Ind.

[73] Assignee: General Motors Corporation, Detroit, Mich.

[21] Appl. No.: 668,195

[22] Filed: Nov. 5, 1984

Related U.S. Application Data

[62] Division of Ser. No. 468,149, Feb. 22, 1983.

[51] Int. Cl.⁴ .................. H01L 29/72; H01L 29/54; H01L 27/10; H01L 29/08
[52] U.S. Cl. ..................................... 357/43; 357/35; 357/59; 357/34
[58] Field of Search .............. 357/34, 43, 59 G, 59 K, 357/35

[56] References Cited

U.S. PATENT DOCUMENTS

| | | | |
|---|---|---|---|
| 3,609,479 | 9/1971 | Chang-Lin | 357/42 |
| 4,033,026 | 7/1977 | Pashley | 357/41 X |
| 4,066,473 | 1/1978 | O'Brien | 148/1.5 |
| 4,196,443 | 4/1980 | Dingwall | 357/68 |
| 4,205,333 | 5/1980 | Yamamoto | 357/35 |
| 4,276,688 | 7/1981 | Hsu | 357/42 X |
| 4,305,760 | 12/1981 | Trudel | 148/1.5 |
| 4,311,532 | 1/1982 | Taylor | 357/43 |
| 4,325,180 | 4/1982 | Curran | 357/35 |
| 4,503,603 | 3/1985 | Blossfeld | 357/43 |

FOREIGN PATENT DOCUMENTS 58-170062  10/1983  Japan ..................... 357/35

Primary Examiner—Andrew J. James
Assistant Examiner—Jerome Jackson, Jr.
Attorney, Agent, or Firm—Robert J. Wallace

[57] ABSTRACT

An integrated circuit is made that includes an insulated gate transistor and a buried contact. The buried contact is used to divide an active device area in two discrete parts, that are doped during source-drain doping in other active device mesas of the integrated circuit. Discrete contacts to these regions, along with the buried contact, provide an additional type of electrical component in the integrated circuit, such as a bipolar lateral transistor.

4 Claims, 15 Drawing Figures

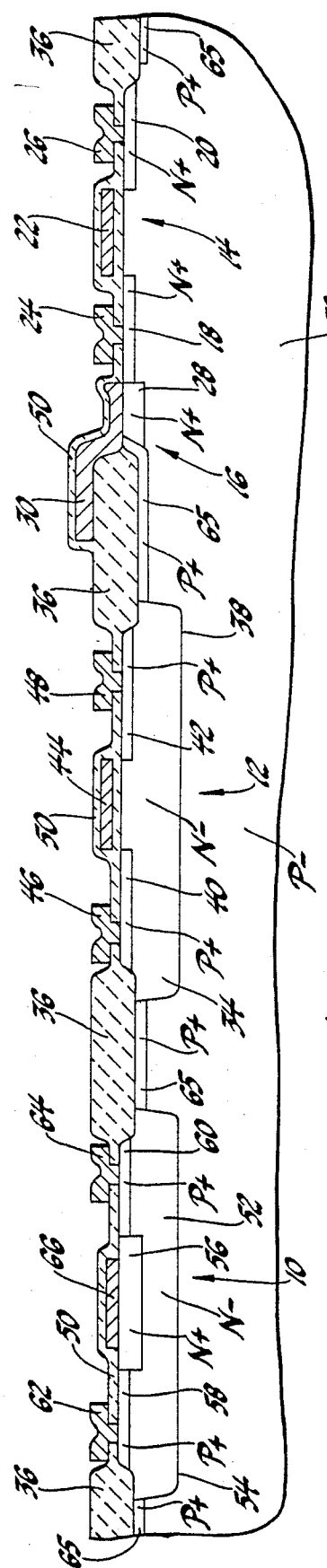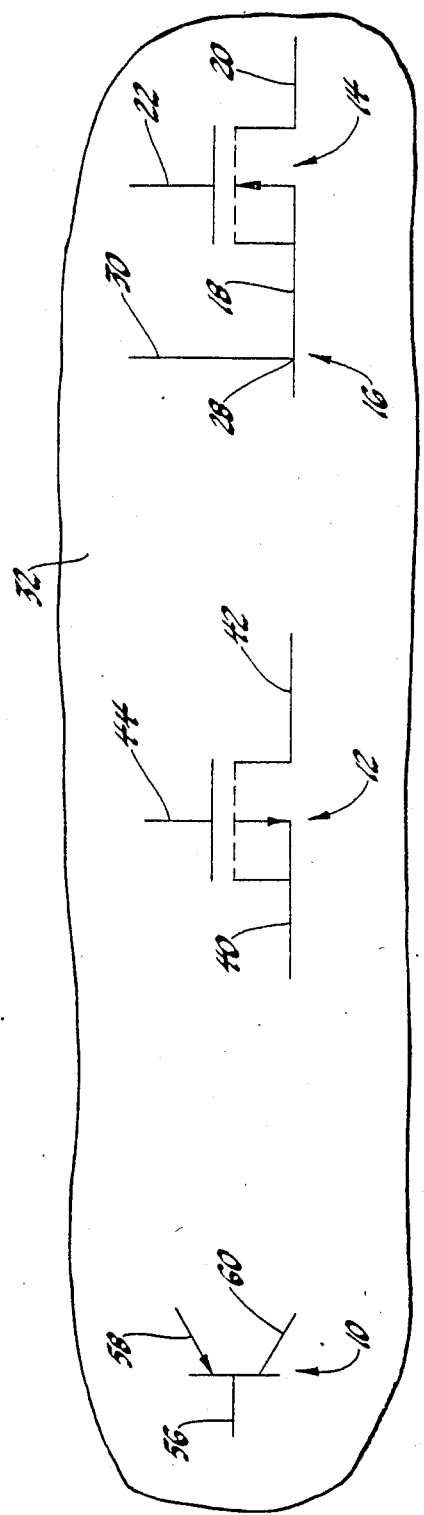

USES FOR BURIED CONTACTS IN INTEGRATED CIRCUITS

This patent application is a division of my U.S. patent application Ser. No. 468,149, that was entitled "New Uses for Buried Contacts in Integrated Circuits" and was filed on Feb. 22, 1983.

FIELD OF THE INVENTION

This invention relates to fabrication of integrated circuits. It more particularly relates to a new use for a buried contact in an insulated gate transistor type of integrated circuit.

BACKGROUND OF THE INVENTION

In summary, a monolithic integrated circuit involves a plurality of transistors formed in a silicon substrate. The substrate is coated with dielectric and the transistors are interconnected by means of a metalization pattern on the dielectric coating that contacts transistor regions through windows in the dielectric coating. A second dielectric coating and second metalization pattern can provide a second layer of interconnections. In integrated circuits made from a plurality of insulated gate transistors, a second level of metalization can be obtained without applying a second dielectric coating and second matalization pattern. Instead, a conductive interconnection pattern is formed from portions of the polycrystalline silicon coating that is used to form the gate electrodes on the insulated gate transistors in the circuit. This supplementary interconnection is referred to as a buried contact type of interconnection. It is achieved by opening a contact window in an active device area before depositing the blanket polycrystalline silicon coating from which the gate electrodes are formed. Diffusion of the dopant from the polycrystalline silicon into the underlying substrate forms a low resistance contact with the substrate. Such contacts, i.e. buried contacts can be used to not only interconnect transistors but also to interconnect a transistor gate region with its own source region.

I have now found how to dispose a buried contact on an active device area, and add to it sourcedrain doping from another active area, to form a new component in an insulated gate transistor type integrated circuit. More specifically, I have found that in an N-type well complementary insulated gate (CMOS) integrated circuit, one can produce a bipolar lateral transistor in that circuit without adding steps to the existing process for making the integrated circuit without the bipolar transistor.

OBJECTS AND SUMMARY OF THE INVENTION

It is therefore an object of the invention to provide an improved method of making an integrated circuit having an insulated gate transistor and a buried contact.

Another object of the invention is to provide a method of making a bipolar PNP lateral transistor in an N-well CMOS integrated circuit without requiring that any additional steps be included in the method.

Still another object of the invention is to provide an improved integrated circuit in which a buried contact is used to provide another type of component in an insulated gate transistor integrated circuit.

A further object of the invention is to provide an integrated circuit having both bipolar lateral transistors along with insulated gate transistors and buried contacts.

The invention comprehends using a buried contact to divide an active device area into at least two discrete parts on opposite sides of the buried contact. The conductivity in each active device area part is altered, i.e. enhanced or converted to opposite conductivity type, when doping transistor regions in other parts of the integrated circuit. Discrete electrical contacts are made to the active device area parts when contacting the regions of the other transistors. The buried contact inherently provides a low resistance contact to the active device area region beneath the buried contact. In a preferred example this technique is used to form a bipolar lateral transistor as an additional type of electrical component in an integrated circuit having an insulated gate transistor and a buried contact.

BRIEF DESCRIPTION OF THE DRAWING

Other objects, features and advantages of the invention will become more apparent from the following description of the preferred embodiments thereof and from the drawing in which:

FIG. 1 shows a fragmentary cross-sectional view of an N-type well CMOS integrated circuit having a bipolar lateral PNP transistor formed in accordance with this invention;

FIG. 2 shows an electrical schematic of the integrated circuit portion shown in FIG. 1;

FIG. 4 shows a fragmentary view along the line 4—4 of FIG. 3a;

Figure 3A:
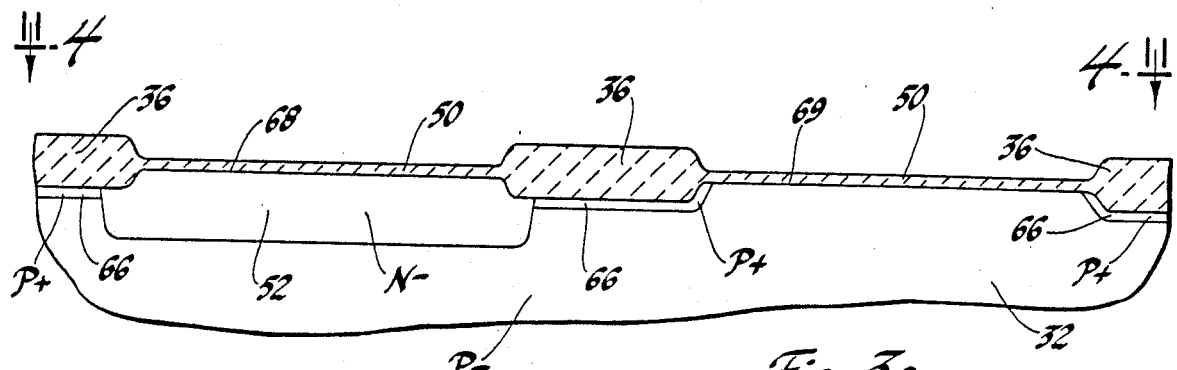
FIGS. 3a through 3g show fragmentary sectional views illustrating successive steps in my method of forming a lateral bipolar transistor in an N-type well of an N-type well CMOS integrated circuit.

For simplicity, no cross-section lines have been shown in the semi-conductive substrate. Analogously, background lines have been omitted. It should also be mentioned that the various regions and layer thicknesses are not drawn to scale in order to focus better on the novel parts of this invention.

DESCRIPTION OF THE PREFERRED EMBODIMENTS

As previously mentioned, my invention involves forming an additional component in an insulated gate field effect transistor type of integrated circuit that also contains a buried contact, without reguiring that additional steps be included in the process for making the integrated circuit. I recognize that one might choose to include additional steps in the process to enhance performance or produce still other effects with the additional component. However, using such additional steps should not be construed as avoiding use of this invention.

Also, a particularly desirable additional component which one would might want to include is a bipolar transistor. Accordingly, the following description focuses on making a bipolar transistor as the additional component in the insulated gate intregated circuit. However, the additional component might be a unipolar transistor, a pinch resistor, or the like, depending on substrate conductivity beneath the active device area for the additional component, region doping for the additional component, voltages applied to contacts for these regions, etc. These latter thoughts will be referred to again and will become more apparent from the following discussion.

Reference is now made to FIG. 1 which shows a fragmentary sectional view of an N-type well complementary insulated gate (CMOS) integrated circuit. The circuit contains both p-channel and n-channel (NMOS) insulated gate transistors. Hence it has complementary transistors. The PMOS transistors are disposed in an island like region, or well, of n-type silicon and a buried contact 16 are shown in a silicon chip 32 in FIG. 1. FIG. 2 shows an electrical schematic of FIG. 1. Chip 32 is but one part of a silicon wafer containing many similar chips. Component 14 is an NMOS transistor formed on an elongated generally rectangular mesa, that I refer to as an active device area herein. NMOS transistor 14 includes an N+ source region 18 and an N+ drain region 20, with a polycrystalline silicon gate electrode 22 between them. A thin silicon oxide coating 50, having appropriate contact windows covers source and drain regions 18 and 20 and gate electrode 22. It also is below gate electrode 22 and serves as a gate dielectric. A metal contact 24 is provided for the source region 18. A metal contact 26 is provided for the drain region 20. The NMOS transistor source region 18 is in low resistance electrical communication with the buried contact 16 because it is contiguous N+ region 28, which is in turn contiguous an overlying polycrystalline silicon conductor element 30.

Accordingly, buried contact 16 is conventional. Analogously, NMOS transistor 14 is a conventional enhancement type N-channel transistor. If NMOS transistor 14 were of a depletion type, polycrystalline silicon element 30 might be connected to gate electrode 22, and no metal contact 24 would be required for gate region 22. In addition, there would be an N-type region beneath the gate electrode 22.

Chip 32 has an island-like N-type region, or well, 34 within which a second mesa is formed. The PMOS transistor 12 is disposed on the mesa top, which is generally elongated and rectangular. The N-type well 34 is of fairly high resistivity. In this example, each component is disposed on its own rectangular mesa that is, in turn, surrounded by an area 36 of thick thermally grown silicon dioxide 36. The surrounding thick oxide 36 serves as a field oxide. A PN junction 38 between N-type well 34 and the balance of P− material of chip 32 intersects the chip surface beneath the surrounding thick oxide 36. PMOS transistor 12 includes a source region 40 and a drain region 42, with polycrystalline silicon gate electrode 44 between them. Like NMOS transistor 14, source, drain and gate of PMOS transistor 12 are covered by a silicon oxide layer 50 that has appropriate contact holes in it. It also covers gate electrode 44. Source region 40 has a metal contact 46. Drain region 42 has a metal contact 48. Gate electrodes 22 and 44 and base electrode 66 have metal contacts analogous to those shown for source regions 18 and 40, drain regions 20 and 42, emitter regions 58 and collector regions 60. However, they are not shown in the drawing because they are outside the field of view.

The added component in this N-type well CMOS integrated circuit that is made in accordance with this invention is the component indicated by reference numeral 10. As can be seen from FIG. 2, it is a bipolar transistor. It too is formed on an elongated generally rectangular mesa, analogous to the PMOS and NMOS transistors 12 and 14. The mesa is disposed over a moderately high resistivity N-type well 52, that is identical to the N-type well 34 for PMOS transistor 12. It is preferably identical but it is not necessary that it be identical. There is a PN junction 54 between the N-well 52 and the surrounding high resistivity P-type material of chip 32. The PN junction 54 intersects the upper surface of chip 32 beneath the field oxide 36 on upper surface of chip 32.

The bipolar transistor 10 comprises an N+ region 56 that is disposed between two P+ surface regions 58 and 60. P+ regions 58 and 60 respectively serve as emitter and collector for the bipolar transistor 10. Buried contact region 56, below polycrystalline silicon element 66, serves as a base region for bipolar transistor 10. A metal contact 62 is provided for emitter region 58. A metal contact 64 is provided for collector region 60. Polycrystalline silicon element 66 provides a base electrode for base region 56.

In substance the bipolar transistor is formed by forming the base electrode 66 and its underlying N+ base region 56 at the same time that buried contact 30 and its underlying N+ region 28 is formed. The emitter and collector regions 58 and 60 are formed at the same time the source and drain regions 40 and 42 are formed for the PMOS transistor 12. Like the PMOS and NMOS transistors 12 and 14, the emitter and collector regions 58 and 60 and polycrystalline silicon source electrode 66 of bipolar transistor 10 are covered with a thin layer of silicon oxide 50.

A method for making a device such as shown in FIG. 1 is illustrated in FIGS. 3a through 3g. For simplicity, and in order to better focus on how the buried contact is used in this invention, I elected to omit the PMOS transistor portion of chip 32 in FIGS. 3a through 3g. Correspondingly it is also omitted from FIGS. 4 through 7.

A mesa surface conformation is formed on chip 32 first. It can be done in the usual manner. For example, chip 32 can be subjected to a blanket oxidation. After that, a photoresist mask is applied, and elongated rectangular windows opened in the photoresist coating over chip surface areas where the N-type wells are to be produced. Chip 32 is then etched to selectively remove the silicon oxide coating in exposed within the mask windows, and the upper surface of chip 32 is given a blanket phosphorous implant. The resist is stripped from the surface. The chip is then heated to drive the implanted phosphorous deeply into the chip surface, to form the N-type wells such as N-type well 52.

The remaining portions of the first blanket silicon oxide coating are then stripped from the upper surface of chip 32. Chip 32 is then subjected to a second oxidation to form a thin blanket silicon oxide coating on its surface. A blanket coating of silicon nitride is then deposited onto the thin silicon oxide coating. Grid-like windows are then photolithographically opened in the silicon nitride coating over chip surface areas where field oxide is going to be grown. This leaves island-like silicon nitride patches over chip surface areas that will subsequently be mesa tops. However, before the field oxide is grown, and the attendant mesas formed, the upper surface of chip 32 is again covered with a photoresist field implant mask to cover the N-type wells, and the upper surface of chip 32 is given a field implant of boron at about 25 keV.

Figure 4:
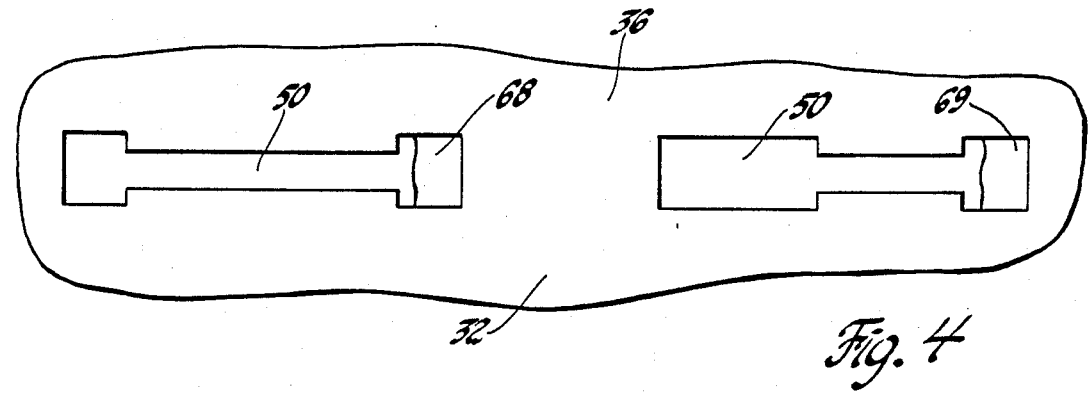

Chip 32 is then heated in an oxidizing atmosphere for a sufficient duration to grow a thick field oxide 36 on its surface. Concurrently, the previously implanted boron ions diffuse more deeply into chip 32. The result is that the boron ions form P+ regions 66 beneath the field oxide outside the N-type wells. The silicon nitride and its underlying thin silicon oxide are then etched away to expose the underlying mesa tops 68 and 69. Mesa tops 68 and 69 are elongated and generally rectangular, with rectangularly enlarged ends. A thin blanket coating of silicon oxide 50 is then formed over the mesa tops 68 and 69 to provide the structure shown in FIG. 3a. FIG. 4 shows the outline of thin oxide, i.e. the mesa tops 68 and 69, on chip 32 after this last oxidation. Mesa top 69 is enlarged at its left end to accommodate a buried contact. Incidentally, this last thin silicon oxide coating is to be used as a gate dielectric in the finished transistors. Accordingly, it is preferably of high purity at this stage in the process.

The upper surface of chip 32 is then given a blanket implant with boron to adjust threshold voltage of the enhancement transistors which are to be subsequently formed on the upper surfaces of chip 32, as for example on mesa top 69. A photoresist mask is then formed on the upper surface of chip 32 for ion implant doping of channels for N-channel depletion transistors. In this mask, windows are opened over the gate areas of the NMOS depletion transistors. The upper surface of chip 32 is then given a blanket implant with phosphorous. Up to this point, processing is conventional. It is essentially the same as one would normally use for a prior art N-type well CMOS integrated circuit. Masks used are all conventional.

Figure 3B:
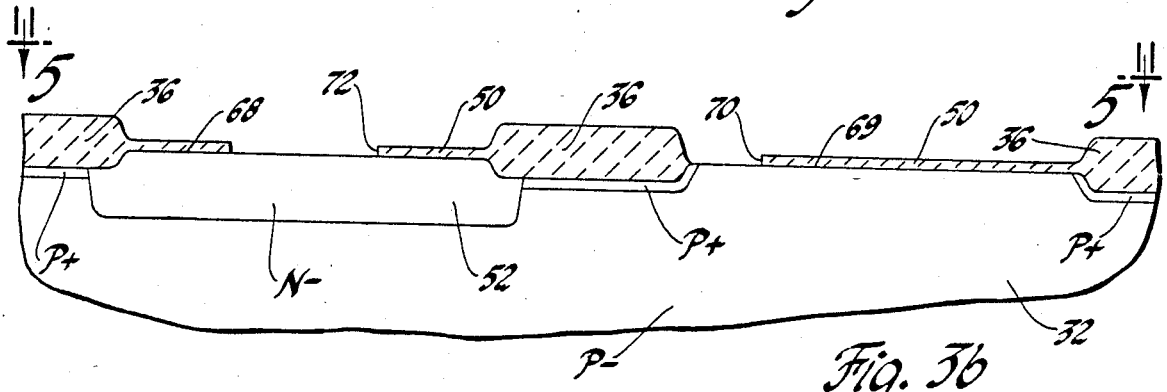
Figure 5:
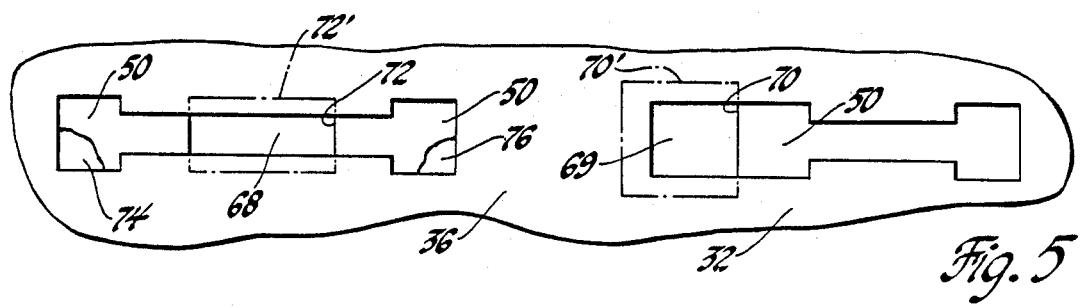
FIG. 5 shows a fragmentary plan view along line 5—5 of FIG. 3b.

On the other hand, a buried contact is next formed. The buried contact mask used in this invention differs from a conventional buried contact mask. As can be seen in FIG. 3b and FIG. 5, my buried contact mask includes the usual window 70 in mesa top 69. However, in addition I also open another buried contact window 72 in mesa top 68 over the N-type well 52. It is seen in FIG. 4 that the left end of mesa 69 has been enlarged to emphasize the buried contact. However, it does not have to be enlarged, and in practice, would ordinarily not be enlarged. No such enlargement is necessary in mesa top 68. The reason for this is that when one opens the additional buried contact window 72 in accordance with this example of this invention, window 72 is not opened over the end of the mesa top 68. It is opened over the middle of the mesa. Moreover, I want it to completely cross mesa 68. Depending on the particular design, window 72 might be located anywhere along a mesa, especially if a single mesa comprises multiple devices, such as an inverter or the like. However, it should completely cross the mesa 68.

FIG. 5 shows that buried contact window 72 can be considered as dividing the mesa top 68 into two end parts 74 and 76. These parts are to be subsequently doped to become the emitter and collector regions of a bipolar lateral PN transistor. Incidently, it should be noted that the dotted lines 70' and 72' shown in FIG. 5 are extensions of the etch line for windows 70 and 72 respectively. However, since the gate oxide 50 is so thin, as compared to the field oxide 36, the window etch line is hardly discernable on the field oxide 36.

Figure 3C:
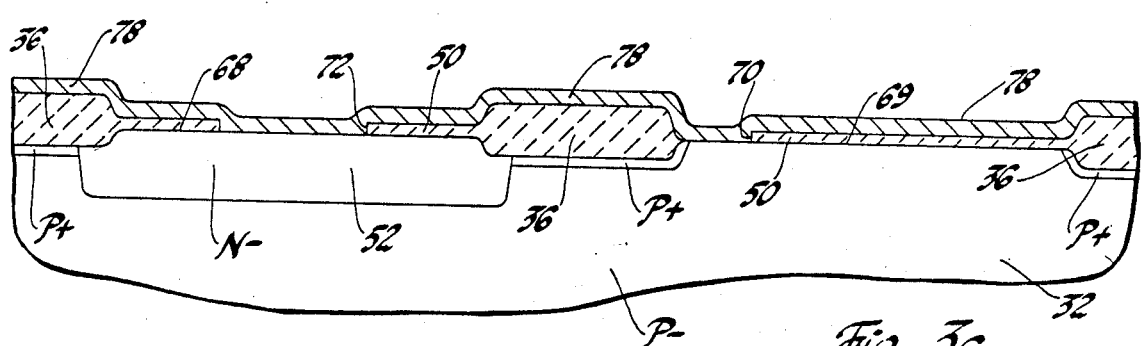

A blanket polycrystalline silicon coating is then deposited onto the surface of chip 32 and phosphorus diffused into it in high concentration. One could dope the polycrystalline silicon coating 78 to N-type conductivity with substantially no drive-in of the phosphorus into the underlying single crystal silicon. I do not choose to do that in this example of the invention. On the other hand, I chose to do that in the example shown in FIG. 9 hereof. As can be seen in FIG. 3c, the blanket polycrystalline silicon coating 78 directly contacts the exposed end of mesa 69 through the conventional buried contact window 70. However, in addition, the blanket polycrystalline silicon coating 78 also directly contacts the exposed center of mesa 68 through the unconventional buried contact window 72.

Figure 3D:
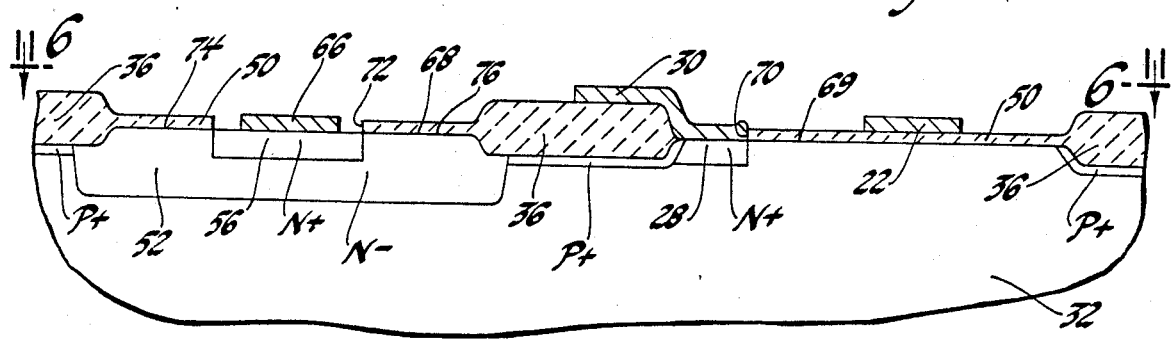
Figure 6:
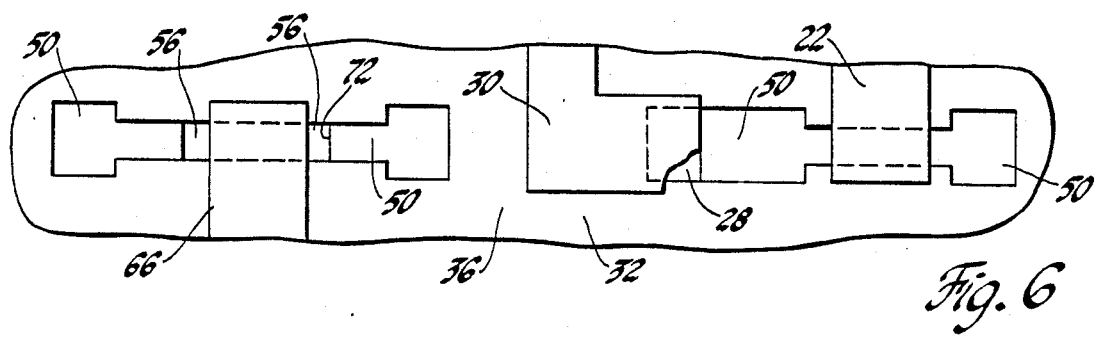
FIG. 6 shows a fragmentary plan view along the line 6—6 of FIG. 3d.
Figure 7:
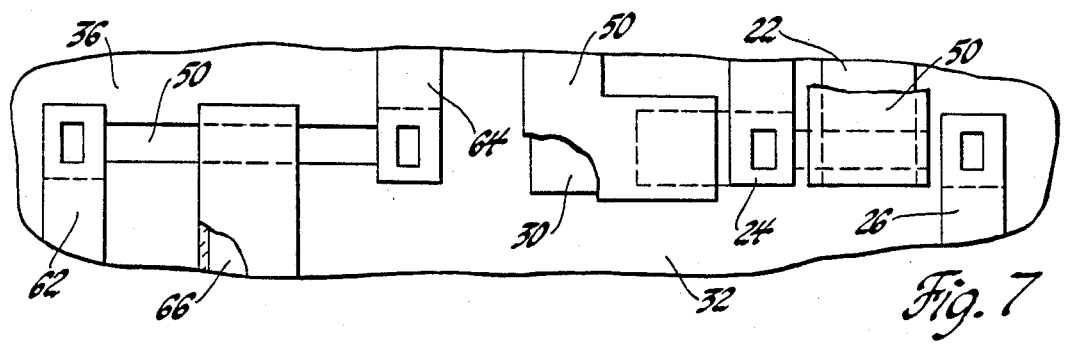
FIG. 7 shows a fragmentary plan view along the line 7—7 of FIG. 3g.

FIGS. 3d and 6 shows the results of the next following steps. A photoresist pattern is delineated over the polycrystalline silicon coating 78. The polycrystalline silicon coating 78 is etched with an etchent selective to polycrystalline silicon, to delineate a gate electrode 22 for mesa 69 and a conventional buried contact lead element 30. PMOS gate electrodes over other N-type wells (not shown) are similarly delineated. However, in addition, polycrystalline silicon element 66 is also delineated over window 72 on mesa top 68. This forms a polycrystalline silicon stripe that extends completely across mesa top 68 within window 72. In so doing, the polycrystalline silicon strip 66 divides mesa top 68, and maintains separation of the mesa top into parts 74 and 76. In this embodiment of the invention the polycrystalline silicon strip 66 is narrower than window 72 and symmetrically disposed within window 72. However, as can be seen from FIGS. 8 and 9 it is not necessary that polycrystalline silicon strip 66 and window 72 be so related. Strip 66 need only cross mesa 68, and divide it into the two parts 74 and 76. However, in this embodiment it currently forms an N+ region 56 beneath it. N+ region 56 is inherently formed during the aforementioned phosphorous diffusion of the polycrystalline silicon blanket layer 78. N+ region 56 is formed at the same time as the N+ buried contact region 28 is formed beneath polycrystalline silicon buried contact element 30. Both regions have confines similar to the buried contact windows that caused them to form. Incidentally, at this point in the process, there are portions of the N+ region 56 exposed along opposite edges of the polycrystalline silicon strip 66 on mesa 68. They can be seen in FIGS. 3d and 6 but pose no problem for further processing, as will be explained.

Figure 3E:
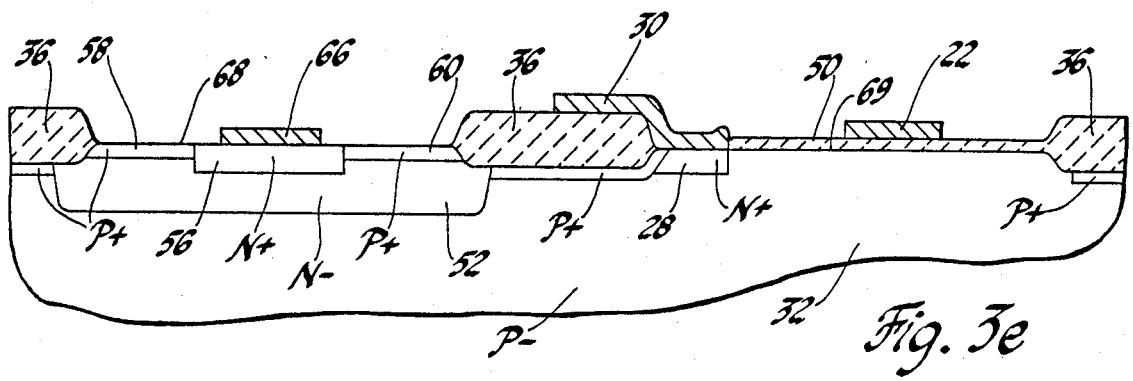

Reference is now made to FIG. 3e. Chip 32 is then masked again with photoresist, so that the photoresist covers all the NMOS active device areas, i.e. mesas such as mesa 69. Preferably, the entire upper surface of chip 32 is covered with resist except for the mesas having N-type wells beneath them. This would not only include mesa 68 but also other mesas (not shown in FIGS. 3a through 3g) where PMOS devices, such as that indicated by reference numeral 12 in FIGS. 1 and 2, would be located. Then the upper surface of chip 32 is given a blanket implant with boron to convert the surface portions of mesa 68 not covered by polycrystalline silicon strip 66 to P+ conductivity. The earlier phosphorus diffusion into and through the polycrystalline silicon coating 78 is heavy enough in concentration to swamp out the boron implantation in all exposed mesa portions and in the polycrystalline silicon. If the earlier phosphorus diffusion was not driven through the polycrystalline silicon before it was delineated, the boron implantation would predominate in regions not covered by the polycrystalline silicon. This latter action would result in a P-type region contiguous an N+ region, analogous to the P+ region 60b shown on the right side of the N+ region 56b in FIG. 9. In substance, this is the implant that would normally be used to form source and drain regions for PMOS transistors in the other N-type wells in chip 32. However, as noted above, in this invention I also use it to form a P+ emitter region 58 and a P+ collector region 60. They are inherently automatically aligned on each end of the active device area designated as mesa top 68.

Chip 32 is then heated again in oxygen to anneal the boron implant. It concurrently reforms a thin coating of silicon oxide 50 over mesa 68, and forms a silicon oxide coating over polycrystalline silicon strip 66. Another photoresist mask is then formed over the chip 32 to etch away thin silicon oxide over the mesa tops where NMOS transistors are to be formed, as for example mesa top 69. However, the buried contact lead element 30 is preferably not also exposed. In such instance, the thin silicon oxide coating 50 formed in the immediately preceding step over the polycrystalline silicon buried contact lead 30 is retained.

Figure 3F:
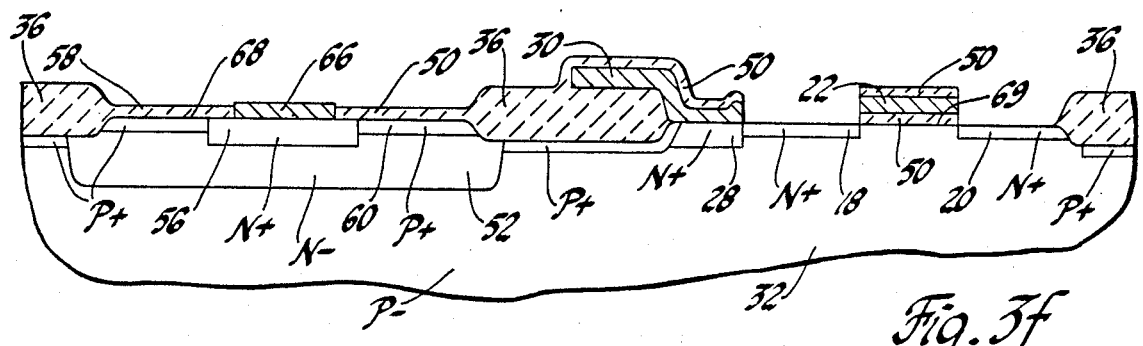
Figure 3G:
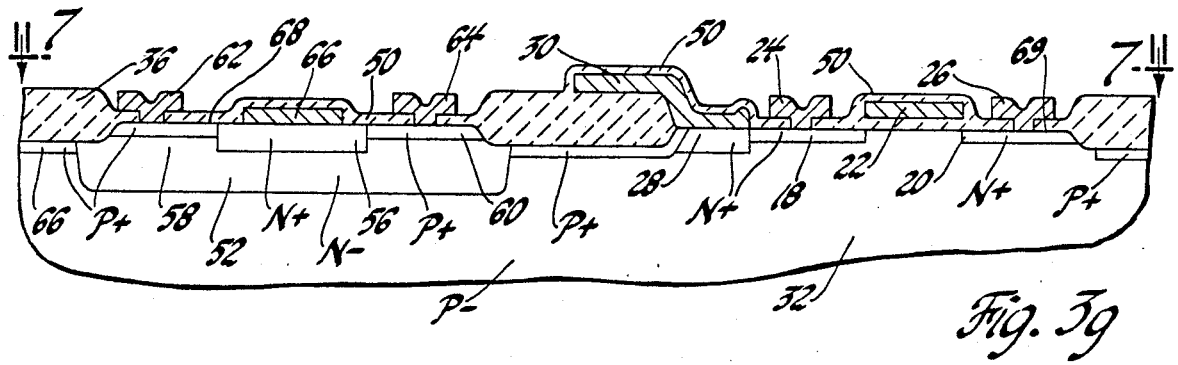

Chip 32 is then immersed in a silicon oxide etchent, which removes all thin silicon oxide 50 not protected by resist. This essentially is silicon oxide over portions of the mesa top 69 which are to become the source and drain regions of the NMOS transistor that is to be formed in that mesa. Chip 32 is then given a blanket phosphorous or arsenic implant to form the source region 18 and the drain region 20 for an NMOS transistor such as indicated by reference numeral 14 in FIGS. 1 and 2. The result is as shown in FIG. 3f.

A blanket phosphosilicate glass coating is then normally formed on the surface of the chip 32 and reflowed. Such a coating is fairly thick and not relevant to this invention. I have chosen not to show such a coating, to avoid distraction from the principle distinctions of this invention. Instead, in FIG. 3g I simply show a thin layer of dielectric 50 over the mesa top 69 and over the gate electrode 22 and base electrode 66. For purposes of illustration I show the thin oxide layer 50 as merely an extension of oxide elsewhere on the chip. Contact windows are then opened in the thin silicon oxide layer 50 over the various device transistor regions. A blanket contact metal coating is deposited onto the upper surface of the chip 32. The blanket metal coating is etched to delineate the respective contacts 62 and 64 for emitter and collector regions 58 and 60, contacts 24 and 26 for source and drain regions 18 and 20, and contacts (not shown) for the polycrystalline silicon gate and base electrodes 22 and 66. A passivation coating would normally be applied on top of the delineated metal. However, I have elected not to show such a coating since it is not relevant to this invention.

Specific details of each step in process hereinbefore described need not be modified to include this invention in the integrated circuit. They can be conventionally performed. For that reason, they have not been specifically described. For specific details on wafer thickness, doping concentration, ion implant conditions, and the like, please see the following, which are incorporated herein by reference:

U.S. Pat. No. 4,295,209—Donley
U.S. Pat. No. 4,299,862—Donley
U.S. Ser. No. 169,527—Donley
U.S. Ser. No. 268,086—Dickman et al
U.S. Ser. No. 268,088—Dickman et al
U.S. Ser. No. 268,089—Dickman et al
U.S. Ser. No. 268,090—Dickman et al On the other hand there is nothing objectionable to modifying details of specific process steps or adding process steps to enhance properties of the additional component formed in accordance with my invention. For example, one may choose to increase the doping level in the source and drain of the PMOS transistor 12, in order to get a higher ratio of emitter to base doping in the bipolar transistor 10. Analogously, one may choose to cover strip portion 66 with a silicon oxide patch during the phosphorus diffusion that takes this coating, adding the silicon oxide patch is an added masking step but one that is not critical on registration. Hence, it may not be an objectionable added step. In any event, the result is to reduce base region doping, which gives a higher emitter to base doping ratio and the attendant higher emitter injection efficiency. A similar effect might be obtained by adding a special emitter implant to the process.

Figure 8:
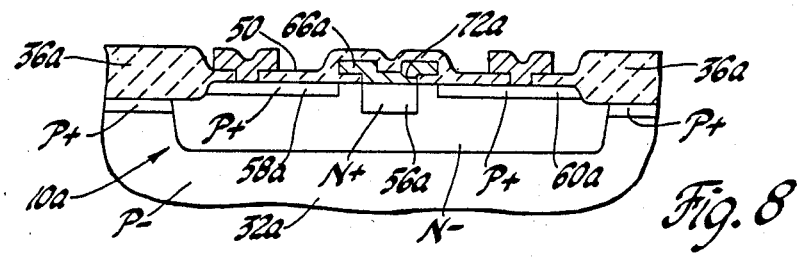
FIG. 8 shows a fragmentary sectional view illustrating another embodiment of this invention.

Still further, one may wish to change geometrics and/or doping of the base region of my added component in still other ways. One of these other ways is shown in FIG. 8. FIG. 8 shows another embodiment 10a for the lateral bipolar transistor 10 of FIG. 1. In this embodiment 10a of the invention, the base contact electrode 66a is wider than the buried contact window 72a. As previously mentioned, the polycrystalline silicon strip 66a is thick enough to block the ion implantations on the upper surface of chip 32a. Accordingly, the N+ base region 56a formed in window 72a beneath the polycrystalline silicon strip 66a is not contiguous the ion implanted emitter and collector regions 58a and 60. This should provide a transistor with different performance from transistor 10 of FIG. 1.

In the earlier described embodiments of this invention, the base contact strip is either narrower or wider than the buried contact window, to eliminate registration problems. If one wanted to, one could attempt to register the base contact strip directly over the base contact window. However, I do not consider this to be a preferred design. Hence I have not illustrated it.

Figure 9:
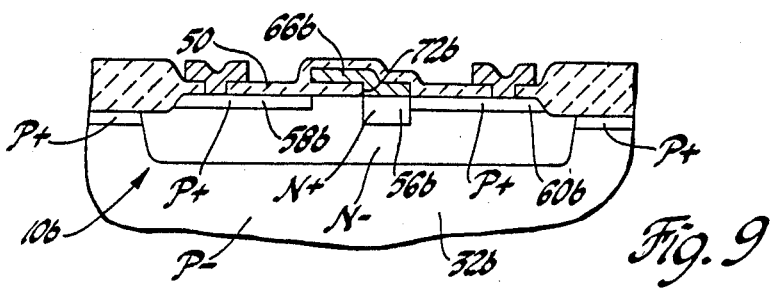
FIG. 9 shows a fragmentary sectional view illustrating still another embodiment of this invention.

Further, in the examples thus far described in detail, FIG. 1 has illustrated that the base contact strip is symmetrically located with respect to its buried contact window. In other words, for example, in FIG. 1 the base contact strip 66 is disposed in the center of buried contact window 66. In FIG. 8 the buried contact window 56a is located in the center of the base contact strip 66a. A symmetrical design is not required. For example, one can deliberately misalign the polycrystalline silicon base contact strip. The offset, i.e. nonsymmetrical alignment of the base contact strip 66b is shown in FIG. 9. In this further embodiment of the invention, the left hand edge of polycrystalline silicon strip 66b overlaps the buried contact window 72b onto the adjacent thin silicon oxide 50. In this example of the invention, the polycrystalline silicon is delineated from a blanket coating before its phosphorus doping is driven into the underlying silicon. Thus, the portion of the buried contact window (not shown) originally uncovered when the polycrystalline silicon is delineated will be doped to P-type conductivity by the boron implant previously described. This causes collector region 60b to directly contact the N+ base region 56b. Accordingly, the out-diffused N+ base region 56b does not intersect the emitter region 58b. If the polycrystalline strip 66b overlapped onto the right side of the buried contact window 72b, there would be a corresponding separation between the collector region 60b and the N+ base region 56b.

Still further, I wish to mention that while I have described this invention in connection with an N-type well CMOS integrated circuit, one could just as easily use the principles of this invention in making additional devices in a P-type well CMOS integrated circuit.

Also I have disposed my additional component in an N-type well to form a bipolar transistor. If I dispose the same component structure in the P-type material of chip 32, instead of an N-type well, I can form a junction field effect, i.e. unipolar, transistor. If I choose not to apply a voltage to the base region of the unipolar transistor, the component would be a pinch resistor. Still further, one may choose to use the NMOS source-drain implant in combination with the N+ region beneath the polycrystalline silicon layer to form a simple resistor of low resistivity. Such an arrangement might even be used as a cross-under, for the overlying metallization network. In any event, all of these additional components can be added to the circuit without requiring that any additional process steps be included in the manufacture of the circuit. However, it does not preclude one from adding steps to enhance effects of the additional component.

The embodiments of the invention in which an exclusive property or privilege is claimed are defined as follows:

1. In a monolithic integrated circuit having insulated gate field effect transistors (IGFETs) and a polycrystalline silicon buried contact on at least one region of one of the IGFETs, the improvement wherein the integrated circuit also includes an additional device area having a polycrystalline silicon buried contact thereon that forms part of an additional type of electrical device other than an IGFET, the additional device area that is divided by said polycrystalline silicon buried contact into at least two discrete parts, at least one region in each discrete part that contains the same dopant in the same dopant concentration profile through the thickness of the region as is contained in source and drain regions in one of said IGFETs, and discrete electrical contacts of the same material layer on all of said regions for electrically biasing said regions, whereby the regions in said additional device area and their separating buried contact cooperate to form a type of electrical component in the integrated circuit that is in addition to and different from said IGFETs.

2. In an integrated circuit having complementary insulated gate field effect transistors (IGFETs), at least one of which is disposed in an island area of one conductivity type semiconductive material surrounded by opposite conductivity type semiconductive material, and a polycrystalline silicon buried contact on at least one region of the IGFET in the island area, the improvement wherein the integrated circuit also includes at least one additional island area of the one conductivity type, the additional island area has the same predominant dopant in the same predominant dopant concentration profile as in the first-mentioned island area, a bipolar lateral transistor is disposed in the additional island area, and the bipolar lateral transistor comprises a polycrystalline silicon buried contact on the additional island area that divides the additional island area adjacent the buried contact into two parts and concurrently provides a low electrical resistance contact to the additional island area beneath the polycrystalline silicon buried contact, an opposite conductivity type region in each of the two parts having a predominant dopant and a predominant doping concentration profile through its thickness that is the same as source-drain doping for the other of said complementary IGFETs in the integrated circuit, and discrete electrical contacts to said regions in the additional island area by which the latter regions can be respectively forwardly and reversely biased with respect to a bias applied to the additional island area by the buried contact, effective to form a bipolar lateral transistor in the integrated circuit in addition to the complementary IGFETs.

3. In a monolithic integrated circuit having PMOS and NMOS complementary insulated gate field effect transistors (IGFETs), some of which are disposed in N-type wells, and polycrystalline silicon buried contacts to at least one of the source and drain regions of some of the IGFETs in the N-type wells, the improvement wherein the integrated circuit also includes at least one additional N-type well, the N-type well is identical in predominant conductivity-determining impurity and distribution through the thickness of the N-type well as in the first-mentioned N-type well, a polycrystalline silicon buried contact bisects a surface of the additional N-type well of the integrated circuit into two adjacent parts and provides an N-plus doping completely across a central portion of the N-type well surface and a low resistance electrical connection therewith, a P-type region is disposed in each part of the bisected N-type well surface, source-drain doping in some of the PMOS IGFETs in other N-type wells is identical in predominant conductivity-determining impurity and distribution through the source-drain thickness to that of the P-type regions in the two adjacent parts of the additional N-type well, and discrete electrical contacts for said P-type regions by which those regions can be respectively forwardly and reversely biased with respect to an electrical bias applied to the buried contact, effective to form a bipolar lateral PNP transistor in the additional N-type well in addition to PMOS IGFETs formed in other N-type wells and to buried contacts formed in still other portions of the integrated circuits.

4. The monolithic integrated circuit defined in claim 1 wherein the integrated circuit further contains first and second complementary IGFETs, the first-mentioned polycrystalline silicon buried contact is on the first IGFET, and the regions in the discrete parts of the additional device area have a predominant doping that is the same in impurity and impurity concentration profile through their thickness as is contained in the source and drain regions of the the second IGFET, whereby those regions and the buried contact on that additional area comprise a bipolar lateral transistor.

* * * * *